(12) United States Patent
Huang et al.

(10) Patent No.: US 12,324,315 B2
(45) Date of Patent: Jun. 3, 2025

(54) DISPLAY PANEL AND MANUFACTURING METHOD THEREFOR, AND DISPLAY APPARATUS

(71) Applicant: BOE TECHNOLOGY GROUP CO., LTD., Beijing (CN)

(72) Inventors: Qingyu Huang, Beijing (CN); Zhiqiang Jiao, Beijing (CN); Huajie Yan, Beijing (CN); Fudong Chen, Beijing (CN); Xiaohu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 92 days.

(21) Appl. No.: 17/763,215

(22) PCT Filed: May 8, 2021

(86) PCT No.: PCT/CN2021/092387
§ 371 (c)(1),
(2) Date: Mar. 24, 2022

(87) PCT Pub. No.: WO2021/238621
PCT Pub. Date: Dec. 2, 2021

(65) Prior Publication Data
US 2024/0016006 A1    Jan. 11, 2024

(30) Foreign Application Priority Data

May 27, 2020   (CN) .......................... 202010460215.7

(51) Int. Cl.
*H10K 59/122*    (2023.01)
*H10K 59/12*    (2023.01)
(Continued)

(52) U.S. Cl.
CPC ....... *H10K 59/122* (2023.02); *H10K 59/1201* (2023.02); *H10K 59/351* (2023.02); *H10K 59/8791* (2023.02)

(58) Field of Classification Search
CPC . H10K 59/122; H10K 59/879; H10K 59/8791
See application file for complete search history.

(56) References Cited

U.S. PATENT DOCUMENTS 10,454,053 B2   10/2019   Watanabe et al.
10,657,881 B2    5/2020   Suzuki et al.
(Continued)

FOREIGN PATENT DOCUMENTS

| CN | 103915482 A | 7/2014 |
| CN | 107851408 A | 3/2018 |

(Continued)

OTHER PUBLICATIONS

Office action from Chinese Application No. 202010460215.7 dated Oct. 19, 2021.
(Continued)

*Primary Examiner* — Erik Kielin
(74) *Attorney, Agent, or Firm* — Calfee, Halter & Griswold LLP

(57) ABSTRACT

Provided is a display panel including a plurality of sub-pixels and includes a substrate and a pixel defining layer, a light emitting device and a color film layer disposed on the substrate. The pixel defining includes M layers and M being a positive integer equal to or greater than 2, an m-th layer of pixel defining layer is covered on a surface of an (m−1)-th layer of pixel defining layer, and a refractive index $n_{m-1}$ of the (m−1)-th layer of pixel defining layer is greater than a refractive index $n_m$ of the m-th layer of pixel defining layer, and wherein $2 \leq m \leq M$.

14 Claims, 3 Drawing Sheets

(51) Int. Cl.
  *H10K 59/35* (2023.01)
  *H10K 59/80* (2023.01)

(56) References Cited

U.S. PATENT DOCUMENTS

| | | | |
|---|---|---|---|
| 10,686,151 | B2 | 6/2020 | Watanabe et al. |
| 2012/0126272 | A1* | 5/2012 | Kurata .................. H05B 33/14 |
| | | | 257/E33.064 |
| 2014/0027735 | A1* | 1/2014 | Kim ..................... H10K 50/858 |
| | | | 257/40 |
| 2015/0188093 | A1* | 7/2015 | Kim ..................... H10K 59/122 |
| | | | 257/40 |
| 2015/0228697 | A1* | 8/2015 | Liu ........................ H10K 59/12 |
| | | | 438/23 |
| 2018/0226016 | A1 | 8/2018 | Suzuki et al. |
| 2019/0036057 | A1 | 1/2019 | Watanabe et al. |
| 2019/0067394 | A1* | 2/2019 | Cheon .................. G09G 3/3225 |
| 2019/0157362 | A1* | 5/2019 | Rho ................. H10K 59/80515 |
| 2019/0165058 | A1* | 5/2019 | Managaki ............ H10K 50/856 |
| 2020/0006691 | A1 | 1/2020 | Watanabe et al. |
| 2020/0135820 | A1 | 4/2020 | Ohchi |
| 2020/0372855 | A1 | 11/2020 | Suzuki et al. |

FOREIGN PATENT DOCUMENTS

| | | |
|---|---|---|
| CN | 108649057 A | 10/2018 |
| CN | 110120460 A | 8/2019 |
| CN | 110600508 A | 12/2019 |
| CN | 110649078 A | 1/2020 |
| CN | 110832954 A | 2/2020 |
| CN | 111063269 A | 4/2020 |
| CN | 111584754 A | 8/2020 |
| CN | 110120460 B | 2/2021 |
| WO | 2020206825 A1 | 10/2020 |

OTHER PUBLICATIONS

Allowance from Chinese Application No. 202010460215.7 dated Jun. 6, 2022.
International Search Report from PCT/CN2021/092387 dated Aug. 11, 2021.
Written Opinion from PCT/CN2021/092387 dated Aug. 11, 2021.

\* cited by examiner

DISPLAY PANEL AND MANUFACTURING METHOD THEREFOR, AND DISPLAY APPARATUS

CROSS REFERENCE

The present application is based upon International Application No. PCT/CN2021/092387, filed on May 8, 2021, which is based upon and claims priority to Chinese Patent Application No. 202010460215.7, filed on May 27, 2020 and entitled "DISPLAY PANEL AND MANUFACTURING METHOD THEREFOR, AND DISPLAY APPARATUS", and the entire contents thereof are incorporated herein by reference.

TECHNICAL FIELD

The present disclosure relates to the field of display technology, in particular, to a display panel and a manufacturing method therefor, and a display apparatus.

BACKGROUND

OLED display panels have been widely used in cell phones and other electronic products with display functions.

Among the technologies proposed so far, the use of color film layers for OLED display panels to achieve full color is superior in terms of color expression and contrast compared to the traditional independent pixel light emission of RGB triplet. For example, WOLED display technology uses a combination of white light emitting and color film layers to achieve full-color display. Three white light emitting OLED devices are combined with RGB tri-color color film layers to form a visual tri-color light emitting, which results in more uniform white light, higher brightness and longer life. For example, in QD-OLED display technology, the OLED light emitting material is used as the backlight, and the quantum dots (QD) is used as the color film layer, and the light from the backlight is transformed by the quantum dots color film layer to achieve full color.

It should be noted that, information disclosed in the above background portion is provided only for better understanding of the background of the present disclosure, and thus it may contain information that does not form the prior art known by those ordinary skilled in the art.

SUMMARY

The present disclosure provides display panel and a manufacturing method therefor, and a display apparatus.

According to one aspect, the present disclosure provides a display panel including a plurality of sub-pixels, wherein the display panel includes:
  a substrate;
  a pixel defining layer, disposed on the substrate and including an opening area corresponding to each sub-pixel, wherein the pixel defining layer including M layers and among the M layers of pixel defining layer, an m-th layer of pixel defining layer is covered on a surface of an (m−1)-th layer of pixel defining layer, and a refractive index $n_{m-1}$ of the (m−1)-th layer of pixel defining layer is greater than a refractive index n m of the m-th layer of pixel defining layer, and wherein M is a positive integer equal to or greater than 2 and 2≤m≤M;
  a light emitting layer, disposed in the opening area, wherein the light emitting layer is in contact with a sidewall of an M-th layer of pixel defining layer, and light emitted from the light emitting layer includes a first light incident into the pixel defining layer, and the first light is able to be total reflected in the (m−1)-th layer of pixel defining layer, when the first light propagating in the (m−1)-th layer of pixel defining layer has an angle of incidence at the interface between (m−1)-th layer of pixel defining layer and the m-th layer of pixel defining layer greater than a critical angle; and
  a color film layer, disposed at a side of the light emitting layer away from the substrate.

In an example embodiment of the present disclosure, M=3, and a first layer of the pixel defining layer has a first refractive index $n_1$, a second layer of the pixel defining layer has a second refractive index $n_2$, and a third layer of the pixel defining layer has a third refractive index $n_3$, wherein $n_1 > n_2 > n_3$.

In an example embodiment of the present disclosure, the light emitting layer has a refractive index n, and wherein $n_3 \geq n$.

In an example embodiment of the present disclosure, the first layer of pixel defining layer includes titanium dioxide, the second layer of pixel defining layer includes silicon oxynitride, and the third layer of pixel defining layer includes silicon dioxide.

In an example embodiment of the present disclosure, the plurality of sub-pixels including a red sub-pixel, a green sub-pixel, and a blue sub-pixel, and wherein the light emitting layer includes a blue organic light emitting layer disposed in respective sub-pixel, and the color film layer includes a red quantum dot layer disposed in the red sub-pixel and a green quantum dot layer disposed in the green sub-pixel.

In an example embodiment of the present disclosure, the plurality of sub-pixels including a red sub-pixel, a green sub-pixel, and a blue sub-pixel, and wherein the light emitting layer includes a white organic light emitting layer disposed in respective sub-pixel, and the color film layer includes a red filter layer disposed in the red sub-pixel, a green filter disposed in the green sub-pixel, and a blue filter layer disposed in the blue sub-pixel.

In an example embodiment of the present disclosure, the color filter film is disposed in the opening area.

According to another aspect of the present disclosure, there is provided a method for manufacturing a display panel, including:
  providing a substrate;
  forming a pixel defining layer on the substrate, wherein the pixel defining layer includes an opening area corresponding to each sub-pixel, and wherein the pixel defining layer includes M layers and among the M layers of pixel defining layer, an m-th layer of pixel defining layer is covered on a surface of an (m−1)-th layer of pixel defining layer, and a refractive index $n_{m-1}$ of the (m−1)-th layer of pixel defining layer is greater than a refractive index $n_m$ of the m-th layer of pixel defining layer, and wherein M is a positive integer equal to or greater than 2 and 2≤m≤M;
  forming a light emitting layer in the opening area, wherein the light emitting layer is in contact with a sidewall of an M-th layer of pixel defining layer, and light emitted from the light emitting layer includes a first light incident into the pixel defining layer, and the first light is able to be total reflected in the (m−1)-th layer of pixel defining layer, when the first light propagating in the (m−1)-th layer of pixel defining layer has an angle of incidence at the interface between the (m−1)-th layer of pixel defining layer and the m-th layer of pixel defining layer greater than a critical angle; and forming a color film layer at a side of the light emitting layer away from the substrate.

In an example embodiment of the present disclosure, M=3, and a first layer of the pixel defining layer has a first refractive index $n_1$, a second layer of the pixel defining layer has a second refractive index $n_2$, and a third layer of the pixel defining layer has a third refractive index $n_3$, wherein $n_1 > n_2 > n_3$, wherein during the forming of the pixel defining layer, a slope angle "ø" between a sidewall of the pixel defining layer and the substrate is calculated in advance, and then the pixel defining layer is formed according to the slope angle "ø", wherein calculating of the slope angle "ø" includes:

defining L as a distance between adjacent sub-pixels, H as a distance between the light emitting layer and the color film layer, and $\lambda_{out}$ as a minimum angle between a thickness direction of the substrate and the first light causing optical crosstalk, and resulting in formula $$\lambda \text{out} = \arctan\frac{L}{H}; \quad (1)$$

defining n as refractive index of the light emitting layer and $n_3 = n$, $\theta_1$ as an incident angle of the first light onto the sidewall of the third layer of the pixel defining layer, and ø as the slop angle between the sidewall of the pixel defining layer and the substrate, and resulting in formula $$\emptyset \leq 180° - \arcsin\left(\frac{n_2}{n_1}\right) - \arcsin\left(\frac{n_3 \sin\theta_1}{n_1}\right); \quad (2)$$

wherein the ø, the $\lambda_{out}$ and the satisfies formula ø32 $\pi - \lambda_{out} - \theta_1$ (3); and calculating the slope angle ø according to the formulas (1), (2) and (3).

According to another aspect of the present disclosure, there is provided a display apparatus including the above display panel.

It is to be understood that both the foregoing general description and the following detailed description are exemplary and explanatory only and are not restrictive of the invention, as claimed.

BRIEF DESCRIPTION OF THE DRAWINGS

The accompanying drawings herein are incorporated into and form part of the specification, illustrate embodiments consistent with the present disclosure, and are used in conjunction with the specification to explain the principles of the present disclosure. It will be apparent that the accompanying drawings in the following description are only some embodiments of the present disclosure, and that other drawings may be obtained from them without creative effort by one of ordinary skill in the art.

In the figures: 100, substrate; 110, pixel defining layer; 111, first pixel defining layer; 112, second pixel defining layer; 113, third pixel defining layer; 120, light emitting device; 121, light emitting layer; 122, anode layer; 123, cathode layer; 130, color film layer; 131, red filter layer; 132, green filter layer; 133, blue filter layer; 134, red quantum dot layer; 135, green quantum dot layer.

DETAILED DESCRIPTION

Example embodiments will now be described more fully with reference to the accompanying drawings. However, the example embodiments can be implemented in a variety of forms and should not be construed as being limited to the embodiments set forth herein; rather, the provision of these embodiments makes the present disclosure comprehensive and complete and conveys the ideas of the example embodiments in a comprehensive manner to those skilled in the art. The same accompanying markings in the figures indicate the same or similar structures, and thus their detailed description will be omitted.

Figure 1:
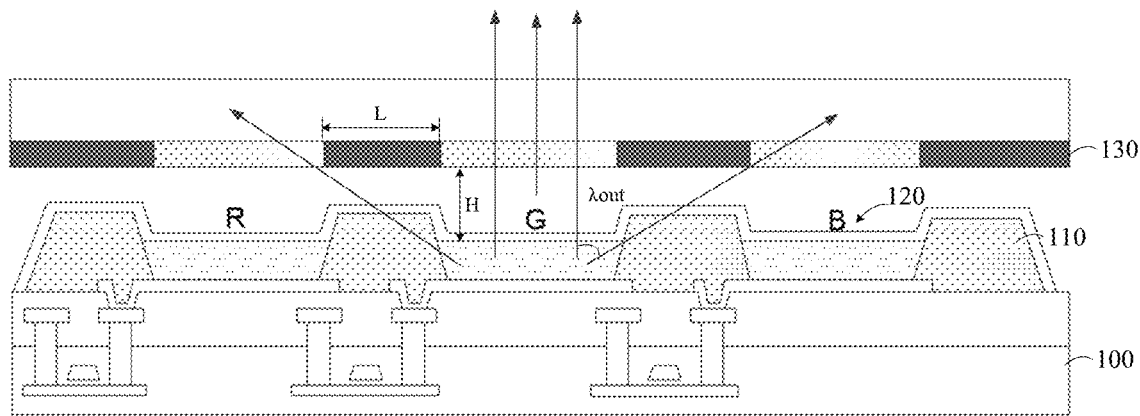
FIG. 1 is a schematic diagram of a display panel in the related art in which light crosstalk occurs.

FIG. 1 is a schematic diagram of a display panel in the related art in which light crosstalk occurs, since there is a certain distance between the light emitting layer and the color filter layer of the OLED light emitting device, when the distance is large, as shown in FIG. 1, the lateral light emitted by the light emitting layer may enter the adjacent sub-pixels through the pixel defining layer, which is absorbed or converted by the color filter layer of adjacent sub-pixels, resulting in problems such as optical crosstalk, viewing angle difference, color separation, etc., which affects the display effect.

The present disclosure provides a display panel having a plurality of sub-pixels, and referring to FIGS. 2-5, the display panel includes a substrate 100 and a pixel defining layer 110 and a light emitting layer 121 disposed on the substrate 100, and also includes a color film layer disposed on a side of the light emitting layer 121 away from the substrate 100. The pixel defining layer 110 has a plurality of opening areas corresponding to each sub-pixel, and the pixel defining layer 110 includes M layers. Among the M pixel defining layers, the m-th layer of pixel defining layer covers the surface of the (m−1)-th layer of pixel defining layer; the refractive index $n_{m-1}$ of the (m−1)-th layer of pixel defining layer is greater than the refractive index $n_m$ of the m-th layer of pixel defining layer; where M is a positive integer greater than or equal to 2, 2≤m≤M. The light emitting layer 121 is provided in the opening area, and the light emitting layer 121 is in contact with the side wall of the m-th layer of pixel defining layer. The light emitted from the light emitting layer 121 includes the first light injected into the pixel defining layer. The first light can be total reflected in the pixel defining layer when the first light propagating within the (m−1)-th layer of pixel defining layer has an angle of incidence at the interface between the (m−1)-th layer of layer pixel defining layer and the m-th layer of pixel defining layer greater than the critical angle of total reflection.

During the propagation of light, if the light enters from the light-dense medium into light-sparse medium, and the angle of incidence increases to a certain angle so that the refraction angle reaches 90°, the refracted light disappears completely and only the reflected light remains, this is called total reflection. The conditions for total reflection are: (1) the light is incident from the light-dense medium into the light-sparse medium; (2) the angle of incidence is greater than or equal to the critical angle.

Based on the principle of total reflection, the present disclosure uses a specific pixel defining layer material and prepares it in a multilayer structure so that the refractive index N of the inner layer is greater than the refractive index n of the outer layer. After the first light emitted laterally from the light emitting layer is incident into the innermost layer of the pixel defining layer, the first light propagates within the innermost pixel defining layer. When the first light reaches the interface to the adjacent pixel defining layer, it is equivalent to entering the light-sparse medium from the light-dense medium. When the angle of incidence of the first light at this interface is greater than the critical angle, the first light then undergoes total reflection within the pixel defining layer. Thus, the structure of this display panel can confine part of the lateral light from the light emitting layer within the pixel defining layer, reducing the light entering the adjacent sub-pixels and reducing the effects of light crosstalk, etc.

The display panel of the embodiment of the present disclosure will be described in detail below.

Figure 2:
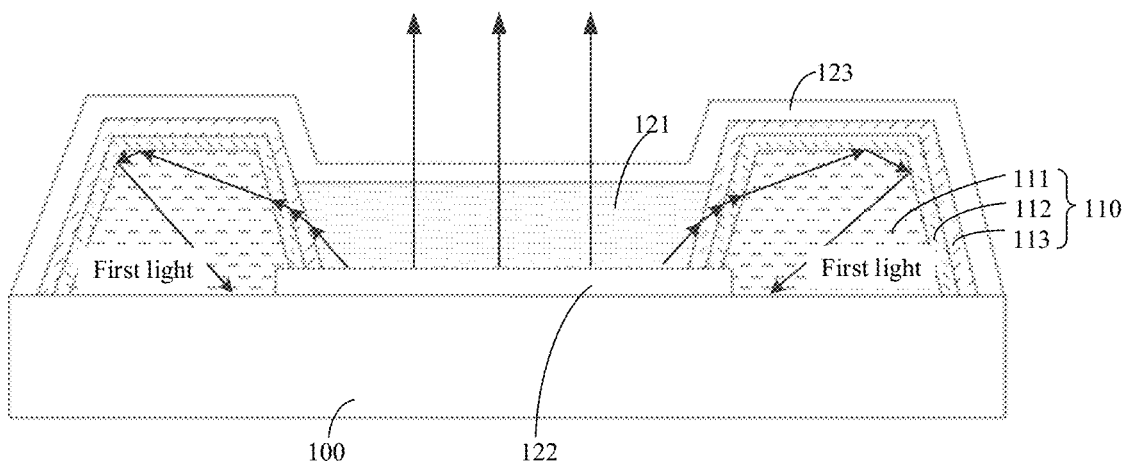
FIG. 2 is a schematic diagram of one structure of the display panel in the embodiment of the present disclosure.

FIG. 2 illustrates a schematic diagram of the panel structure when the pixel defining layer 110 is a three-layer structure. Only one sub-pixel is shown exemplarily in the figure, and the arrows indicate the light propagation path. The light emitted from the light emitting layer 121 includes light emitted vertically upward and a first light emitted into the pixel defining layer 110 to the left and right sides. In this exemplary embodiment, the pixel defining layer 110 includes a first pixel defining layer 111, a second pixel defining layer 112, and a third pixel defining layer 113. The three layers of pixel defining layer 110 are provided in a bottom-up cascade on the substrate 100, i.e., the first pixel defining layer 111 is provided on the substrate 100, the second pixel defining layer 112 covers the surface of the first pixel defining layer 111, and the third pixel defining layer 113 covers the surface of the second pixel defining layer 112. The side wall of the third pixel defining layer 113 is in contact with the light emitting layer 121. Wherein, the first pixel defining layer 111 has a first refractive index $n_1$, the second pixel defining layer 112 has a second refractive index $n_2$, and the third pixel defining layer 113 has a third refractive index $n_3$, wherein $n_1 > n_2 > n_3$.

The first light emitted laterally from the light emitting layer 121 firstly enters the third pixel defining layer 113. Since $n_2 > n_3$, the first light is refracted and enters the second pixel defining layer 112. Since $n_1 > n_2$, the first light is refracted again and enters the first pixel defining layer 111. The first light propagates in the first pixel defining layer 111, and when it reaches the interface between the first pixel defining layer 111 and the second pixel defining layer 112, since $n_1 > n_2$, when the incident angle is greater than the critical angle, the first light is confined to the first pixel defining layer 111. If the incident angle is smaller than the critical angle, the first lights may also enter the second pixel defining layer 112 through refraction. However, since $n_2 > n_3$, when the incident angle of the first light on the interface between the second pixel defining layer 112 and the third pixel defining layer 113 is greater than the critical angle, total reflection will occur on the second pixel defining layer 112. Then, the first light will enter the first pixel defining layer 111 again. Similarly, when the first light propagates in the second pixel defining layer 112, if the incident angle is smaller than the critical angle, the first light may enter the third pixel defining layer 113 through refraction. Therefore, only a small number of the first light will pass through the three-layer pixel defining layer 110 and enter the adjacent sub-pixels, and the influence on the adjacent sub-pixels has been greatly reduced in this case.

In an exemplary embodiment, the refractive index of the light emitting layer is n, and $n_3 \geq n$. Therefore, the light emitted laterally from the light emitting layer can smoothly enter the third pixel defining layer 113. Meanwhile, if $n_3 > n$, when the incident angle of the first light on the interface between the third pixel defining layer 113 and the light emitting layer 121 is greater than the critical angle, total reflection will also occur at the third pixel defining layer 113. Thus, the first light will enter the second pixel defining layer 112 and the first pixel defining layer 111 again, which further reduces the first light entering adjacent sub-pixels.

Of course, in other exemplary implementations, $n_3$ can also be less than n. Thus, it is the case of light-dense medium to light-sparse medium incident if the lateral light emitted from the light emitting layer incidents into the pixel defining layer. In this case, the first light that satisfies a certain angle of incidence can still be injected into the pixel defining layer, and is also able to be confined within the pixel defining layer by total reflection within the multilayer pixel defining layer.

The material of each layer of pixel defining layer 110 determines the refractive index of each layer, which in turn affects the occurrence of total reflection. In this exemplary implementation, the first pixel defining layer 111 is made of titanium dioxide with a refractive index of m=2.2, the second pixel defining layer 112 is made of silicon nitride with a refractive index of $n_2$=1.74, and the third pixel defining layer 113 is made of silicon dioxide with a refractive index of $n_3$=1.5. The refractive index of the three-layered pixel defining layer 110 structure formed by these three materials gradually increases from the outer layer to the inner layer to meet the refractive index requirement. Meanwhile, all the three materials have good properties and can be used to make the pixel defining layer 110.

In other embodiments, the number of layers of the pixel defining layer 110 can be adjusted as desired. It is conceivable that the more layers are provided, the more total reflection occurs between adjacent interfaces. Accordingly, restriction of the first light will be better, thereby effectively prevent the first light from passing through the entire pixel defining layer 110 into the adjacent sub-pixels. However, more layers cause more difficulties for the selection of materials and the complexity of the process. Therefore, in the actual process, the number of layers of the pixel defining layer 110 can be selected according to the needs.

In addition to the refractive index, the slope angle of each layer of the pixel defining layer 110 determines the angle of incidence of the first light emitted laterally from the light emitting layer into the pixel defining layer, which in turn determines whether total reflection of the first light can occur within the pixel defining layer 110. Therefore, a suitable slope angle allows more first light to be fully reflected within the pixel defining layer 110. The slope angle is calculated as follows.

Figure 3:
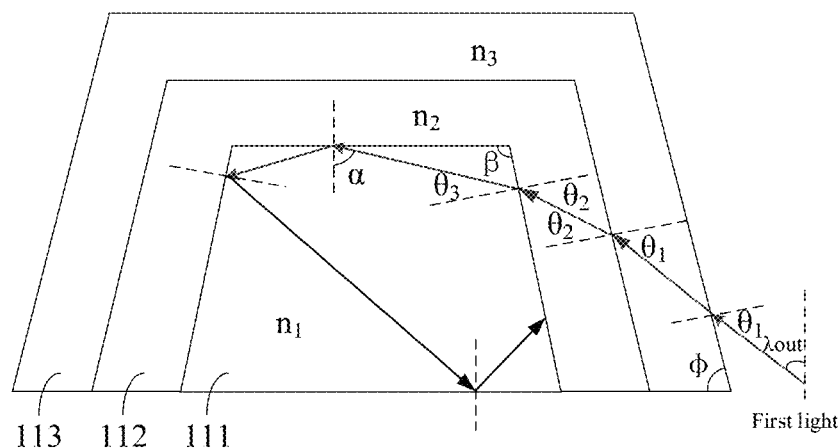
FIG. 3 is a schematic diagram of the light path of in the structure of the pixel defining layer shown in FIG. 2.

FIG. 3 illustrates the light path of the first light propagating within the three-layered pixel defining layer 110. In this exemplary implementation, the third pixel defining layer 113 has a refractive index $n_3$=n. That is, the light beam emitted from the light emitting layer 121 to both sides enters the third pixel defining layer 113 without refraction. Assuming that all three layers of the pixel defining layer 110 are isosceles trapezoidal and uniform at all angles, the following parameters are defined with reference to FIG. 1: the distance between adjacent sub-pixels is assumed to be L, and the distance between the light emitting layer 121 and the color film layer 130 is H. Usually L and H are certain fixed values. Most of the light emitted from the light emitting layer is vertically upward, while the light emitted aside has an angle with the vertical direction. As the angel between the light and the vertical direction increases, gradually some of the light will enter the adjacent sub-pixel, causing optical crosstalk between adjacent pixels. In the case of light emitted by the light emitting layer being symmetrical, the minimum angle between the vertical direction and the first light laterally emitted light from the light emitting layer that goes into adjacent sub-pixel and causes optical crosstalk is defined as goat. That is, starting from the center to both sides, the first beam of light that causes optical crosstalk has an angle goat with the vertical direction, then there is the formula $$\lambda \text{out} = \arctan\frac{L}{H}. \quad (1)$$

The slope angle between the side wall of the pixel defining layer 110 and the substrate 100 is defined as "ø" and the angle of the top angle above the pixel defining layer 110 is β. It is known that β=180°−ø (Equation 1-1). The angle of incidence formed by the first light emitted from the emitting layer 121 to both sides into the side wall of the third pixel defining layer 113 is θ$_1$, that is, the angle of incidence formed by the first light into the side wall of the second pixel defining layer 112 is also θ$_1$. The angle of refraction of the first light in the third pixel defining layer 113 and the second pixel defining layer 112 is θ$_2$, the angle of incidence of the first light into the first pixel defining layer 111 is θ$_2$, and the refraction angle of the first light at the second pixel defining layer 112 and the first pixel defining layer 111 is θ$_3$. The incident light angle at the interface of the second pixel defining layer 112 as the first light propagates within the first pixel defining layer 111 is a.

Assuming that the critical angle for the first light to undergo total reflection when propagating within the first pixel defining layer 111 is α$_{critial}$, then α≥α$_{critial}$ is required, and $$\alpha_{critical} = \arcsin\left(\frac{n_2}{n_1}\right) \quad \text{(Equation 1-2)}$$

can be determined from the refractive index relationship. In addition, it can be determined according to the geometric relationship that α=β−θ$_3$, to make α≥α$_{critial}$, then β−θ$_3$≥α$_{critial}$, get β≥α$_{critial}$+θ$_3$ (Equation 1-3). Further, from the formula of refractive index, it is determined that $$\frac{\sin\theta_3}{\sin\theta_1} = \frac{n_3}{n_1},$$

and thus get $$\theta_3 = \arcsin\left(\frac{n_3\sin\theta_1}{n_1}\right). \quad \text{(Equation 1-4)}$$

According to equation (1-1)-equation (1-4), we can get the equation $$\emptyset \leq 180° - \arcsin\left(\frac{n_2}{n_1}\right) - \arcsin\left(\frac{n_3\sin\theta_1}{n_1}\right). \quad (2)$$

Meanwhile, according to the geometric relationship, the slope angle ø, the λout, and the incidence angle θ$_1$ satisfies the formula ø=π−λ$_{out}$−θ$_1$ (3), therefore, the conditions to be satisfied by the slope angle ø can be calculated from the formulas (1)-(3).

According to the above formulas, the slope angle ø is related to the angle of the first light that causes light crosstalk, so when determining the shape of the pixel defining layer, the slope of the pixel defining layer 110 can be calculated based on the angle of the first light that needs to be restricted.

For the light emitting layer 121, the proportion of first light emitted from its side into the adjacent sub-pixels is influenced by the spacing of the adjacent sub-pixels, and the spacing between the light emitting layer 121 and the color film layer 130. When the spacing between the light emitting layer 121 and the color film layer 130 is smaller, i.e., the closer the spacing between the light emitting layer 121 and the color film layer 130 is, the less first light can be emitted into the pixel defining layer 110, and the optical crosstalk of adjacent subpixels can also be reduced. Therefore, in addition to using the total reflection optical effect of the multilayer pixel defining layer 110, reding of the optical crosstalk can also be achieved by reducing the spacing between the light emitting layer 121 and the color film layer 130. Specifically, it is possible to form the color film layer 130 directly in the opening area of the pixel defining layer 110 by e.g. etching, instead of forming the color film layer 130 on a glass cover. This eliminates the cell aligning process and reduces the spacing between color film layer 130 and light emitting layer 121, which can more effectively reduce optical crosstalk.

The above pixel defining layer 110 structure can be used in a variety of OLED display panels having a color film layer 130 structure, such as WOLED display panels or QD-OLED display panels.

Figure 4:
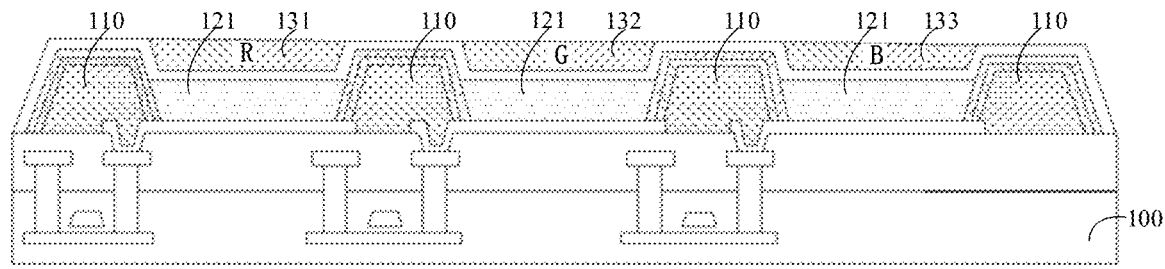
FIG. 4 is a schematic diagram of a structure of a WOLED display panel in the embodiment of the present disclosure.

Taking a WOLED display panel as an example, a schematic diagram of a cross-sectional structure of a pixel unit of a WOLED display panel is shown in FIG. 4. The pixel cell includes three sub-pixel regions: red sub-pixel region, green sub-pixel region and blue sub-pixel region, and includes a substrate 100 on which a TFT (thin film transistor) array is provided. The TFT may have a top gate or bottom gate structure. In the figure, active layer, a gate layer, a source and drain layer (including a source electrode and a drain electrode) and an insulation layer of the top gate driving TFT are shown. In an implementation, the driver transistor may also include other film layers such as passivation layer, planarizing layer, etc., which are not described here. The pixel defining layer 110 is provided above the TFT array, and the opining areas of respective sub-pixels are defined by the pixel defining layer 110. In this exemplary embodiment, the pixel defining layer 110 contains three layers. The opening area is used for disposing the white OLED light emitting devices, and the anode layer 122, the light emitting layer 121, and the cathode layer 123 of each OLED light emitting device 120 are briefly shown in the figure. The anode layer 122 is connected to the drain of the TFT to emit light under the drive of the TFT. The light emitting layer 121 is located in the opening area. In this exemplary embodiment, the light emitting layer 121 includes a white OLED light emitting material. The cathode layer 123 is covered on the light emitting layer 121. Generally, the cathode layer 123 of each sub-pixel of the display panel is a film layer made on the whole side in order to simplify the process. The film layers such as electron transport layer and hole transport layer are omitted in the figure, and the person skilled in the art can understand the specific film layer structure of white OLED.

It should be noted that although each sub-pixel in the figure is illustrated with an independent light emitting layer structure, it is understood by those skilled in the art that since the light emitting layers all include white light emitting material, the entire panel can be formed with a light emitting layer in an integral plan structure, thereby simplifying the process.

In an exemplary embodiment, the color film layer 130 includes a red filter layer 131 disposed on the red sub-pixel, a green filter layer 132 disposed on the green sub-pixel, and a blue filter layer 133 disposed on the blue sub-pixel. The filter layers are used to filter the white light of each sub-pixel to transmit red, blue, and green colors respectively. Each filter layer can be formed directly in the opening area to filter the white light, on the side of the white OLED light emitting device away from the substrate 100, by etching or inkjet printing, etc. In this case, a thin film encapsulation layer will be provided on the color film layer 130 to protect each film layer below.

Figure 5:
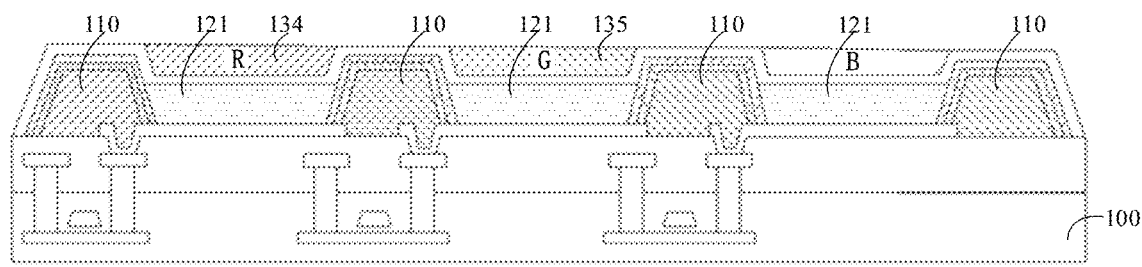
FIG. 5 is a schematic diagram of a structure of a QD-OLED display panel in the embodiment of the present disclosure.

Taking QD-OLED display panel as an example, FIG. 5 shows a schematic diagram of the cross-sectional structure of a pixel unit of a QD-OLED display panel, including a substrate 100, a TFT array, and an OLED light emitting device 120 similar in structure to WOLED display panel. The difference is that the OLED light emitting device 120 is a blue OLED light emitting device, and the color film layer 130 is a quantum dot color film layer, and the quantum dot color film layer is only disposed in the red and green sub-pixels, i.e., the color film layer 130 includes a red quantum dot layer 134 disposed in the red sub-pixels and a green quantum dot layer 135 disposed in the green sub-pixels, and the blue light emitted by the blue OLED light emitting device is converted to red or green by the quantum dot color film layer. In this implementation, color film layer is not required in the blue sub-pixels. The blue light can be directly emitted through the transparent film above, to display blue color. Each quantum dot layer can be formed directly in the opening area, on the side of the blue OLED light emitting device 120 away from the substrate 100, by inkjet printing, etc. In this case, a thin film encapsulation layer will be provided on the quantum dot layer to protect each film layer below.

In other implementations, the WOLED display panel or QD-OLED display panel may also include an upper substrate (not shown in the figure) on which the color film layer 130 is disposed and formed by etching or inkjet printing, etc., and the upper substrate and the substrate 100 are then cell aligned together to form the overall panel structure.

Compared with the structure in which the substrate 100 is cell-aligned, by disposing the color film layer 130 in the opening area, the distance between the light emitting layer 121 and the color film layer 130 is closer, which can reduce the light (i.e., the first light) from the side of the light emitting layer 121 into the adjacent sub-pixels and can effectively improve the problem of optical crosstalk.

Figure 6:
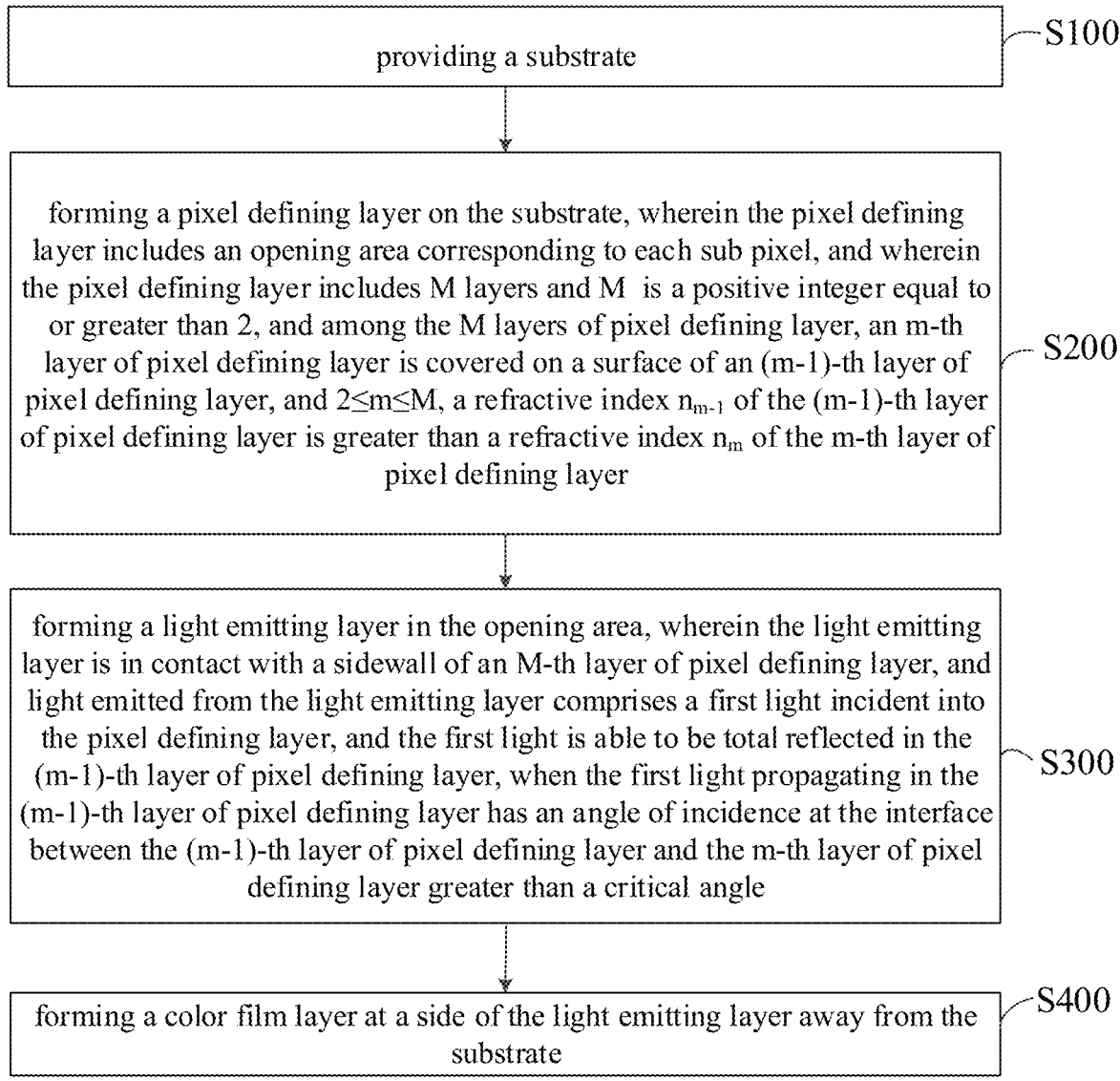
FIG. 6 is a flowchart of the manufacturing method of the display panel in the embodiment of the present disclosure.

Embodiments of the present disclosure further provides a method for manufacturing the above display panel. Referring to FIG. 6, the method includes the following steps.

In step S110, a substrate 100 is provided.

In step S200, a pixel defining layer 110 is formed on the substrate 100. The pixel defining layer 110 includes a plurality of opening areas corresponding to each sub-pixel, the pixel defining layer includes M layers, and of the M pixel defining layers, the m-th layer of pixel defining layer is covered on the surface of the (m−1)-th layer of pixel defining layer; the refractive index $n_{m-1}$ of the (m−1)-th layer of pixel defining layer is greater than the refractive index $n_m$ of the m-th layer of pixel defining layer; wherein M is a positive integer greater than or equal to 2, and $2 \leq m \leq M$.

In step S300, a light emitting layer 121 is formed in the plurality of opening areas, and the light emitting layer 121 is in contact with a side wall of the M-th layer of pixel defining layer. Light emitted from the light emitting layer 121 includes a first light incident into the pixel defining layer 110. The first light can be total reflected in the (m−1)-th layer of pixel defining layer, when the first light propagating in the (m−1)-th layer of pixel defining layer has an angle of incidence at the interface between the (m−1)-th layer of pixel defining layer and the m-th layer of pixel defining layer greater than a critical angle.

In step S400, a color film layer 130 is formed on a side of the light emitting layer 121 away from the substrate 100.

In the above step S200, the pixel defining layer 110 is generally formed by a pattern process. When the pixel defining layer 110 includes multiple layers, multiple above processes are required. When the aforementioned materials such as titanium dioxide, silicon nitride, and silicon dioxide are used, they can be patterned by photolithography, and when photosensitive materials are used, they can be patterned by exposure and development.

Since the slope angle of the pixel defining layer 110 has an impact on the restriction of the first light, the slope angle $\phi$ can be calculated in advance according to the aforementioned method, and then during the patterning process, the slope angle can be adjusted by controlling the area of the opening area, the nature of the developer, the baking temperature and other conventional processes, which are not described here.

In the above step S300, the complete preparation process of the light emitting device is omitted, while those skilled in the art know how to implement it. In addition to the above steps, processes such as forming an encapsulation layer on the surface of the light emitting device 120 may be further included, which will not be repeated here.

Embodiments of the present disclosure further provides a display apparatus, which includes the display panel according to the above embodiments. The display apparatus may have the same advantage effects by including the above display panel, which will be not described here.

According to the present disclosure, particular pixel defining layer layer material is used, so that refractive index N of the pixel defining layer is greater than the refractive index n of the light emitting layer. The first light laterally emitted from the light emitting layer can be incident into the pixel defining layer. When the first light hits the interface between the pixel defining layer and the light emitting layer, the first light will be total reflected in the pixel defining layer if the incident angle of the first light at the interface is greater than the critical angle. Accordingly, the structure of the display panel can confine part of the lateral light of the light emitting layer in the pixel defining layer, reduce the light entering the adjacent sub-pixels, reduce the occurrence of problems such as optical crosstalk, viewing angle difference, color separation, etc., and therefore improve the display effect.

It should be noted that this disclosure does not specifically limit the application of display devices, which can be televisions, notebook computers, tablet computers, wearable display devices, mobile phones, vehicle displays, navigation devices, e-books, digital photo frames, advertising light boxes, or any product or part having a display function.

Although relative terms such as "upper" and "lower" are used in this specification to describe the relative relationship of one component of an icon to another component, these terms are used in this specification only for convenience, such as according to the direction of the example described. It will be appreciated that if the device of the icon is turned upside down, the components described as "upper" will become the "lower" components. When a certain structure is "on" another structure, it may mean that a certain structure is integrally formed on the other structure, or that a certain structure is "directly" arranged on the other structure, or that a certain structure is "indirectly" arranged on the other structure through another structure.

The terms "a", "an", "the", "said" and "at least one" are used to indicate the presence of one or more elements/components/etc; the terms "include" and "have" are used to indicate an open-ended inclusive means, and means that additional elements/components/etc may be present in addition to the listed elements/components/etc.

Other embodiments of the present disclosure will readily occur to those skilled in the art upon consideration of the specification and practice of the disclosure disclosed herein. This application is intended to cover any variations, uses, or adaptations of the present disclosure that follow the general principles of the present disclosure and include common knowledge or techniques in the technical field not disclosed by the present disclosure. The specification and examples are to be regarded as exemplary only, with the true scope and spirit of the disclosure being indicated by the appended claims.

What is claimed is:

1. A display panel having a plurality of sub-pixels wherein the display panel comprises:
   a substrate;
   a pixel defining layer, disposed on the substrate and comprising an opening area corresponding to each sub-pixel, wherein the pixel defining layer comprises M layers and among the M layers of pixel defining layer, an m-th layer of pixel defining layer encapsulates upper and side surfaces of an (m−1)-th layer of pixel defining layer, and a refractive index $n_{m-1}$ of the (m−1)-th layer of pixel defining layer is greater than a refractive index nm of the m-th layer of pixel defining layer, and wherein M is a positive integer equal to or greater than 2 and 2≤m≤M;
   a light emitting layer, disposed in the opening area, wherein the light emitting layer is in contact with a sidewall of an M-th layer of pixel defining layer, and light emitted from the light emitting layer comprises a first light incident into the pixel defining layer, and the first light is able to be totally reflected in the (m−1)-th layer of pixel defining layer, when the first light propagating in the (m−1)-th layer of pixel defining layer has an angle of incidence at the interface between the (m−1)-th layer of pixel defining layer and the m-th layer of pixel defining layer greater than a critical angle; and
   a color film layer, disposed at a side of the light emitting layer away from the substrate,
   wherein M=3, and a first layer of the pixel defining layer has a first refractive index $n_1$, a second layer of the pixel defining layer has a second refractive index $n_2$, and a third layer of the pixel defining layer has a third refractive index $n_3$, wherein $n_1 > n_2 > n_3$.

2. The display panel according to claim 1, wherein the light emitting layer has a refractive index n, and wherein $n_3 \geq n$.

3. The display panel according to claim 1, wherein the first layer of pixel defining layer comprises titanium dioxide, the second layer of pixel defining layer comprises silicon oxynitride, and the third layer of pixel defining layer comprises silicon dioxide.

4. The display panel according to claim 1, wherein the plurality of sub-pixels comprising a red sub-pixel, a green sub-pixel, and a blue sub-pixel, and wherein the light emitting layer comprises a blue organic light emitting layer disposed in respective sub-pixel, and the color film layer comprises a red quantum dot layer disposed in the red sub-pixel and a green quantum dot layer disposed in the green sub-pixel.

5. The display panel according to claim 1, wherein the plurality of sub-pixels comprising a red sub-pixel, a green sub-pixel, and a blue sub-pixel, and wherein the light emitting layer comprises a white organic light emitting layer disposed in respective sub-pixel, and the color film layer comprises a red filter layer disposed in the red sub-pixel, a green filter disposed in the green sub-pixel, and a blue filter layer disposed in the blue sub-pixel.

6. The display panel according to claim 4, wherein the color filter film is disposed in the opening area.

7. A method for manufacturing a display panel, comprising:
   providing a substrate;
   forming a pixel defining layer on the substrate, wherein the pixel defining layer comprises an opening area corresponding to each sub-pixel, and wherein the pixel defining layer comprises M layers and among the M layers of pixel defining layer, an m-th layer of pixel defining layer encapsulates upper and side surfaces of an (m−1)-th layer of pixel defining layer, and a refractive index $n_{m-1}$ of the (m−1)-th layer of pixel defining layer is greater than a refractive index nm of the m-th layer of pixel defining layer, and wherein M is a positive integer equal to or greater than 2 and 2≤m≤M;
   forming a light emitting layer in the opening area, wherein the light emitting layer is in contact with a sidewall of an M-th layer of pixel defining layer, and light emitted from the light emitting layer comprises a first light incident into the pixel defining layer, and the first light is able to be totally reflected in the (m−1)-th layer of pixel defining layer, when the first light propagating in the (m−1)-th layer of pixel defining layer has an angle of incidence at the interface between the (m−1)-th layer of pixel defining layer and the m-th layer of pixel defining layer greater than a critical angle; and
   forming a color film layer at a side of the light emitting layer away from the substrate,
   wherein M=3, and a first layer of the pixel defining layer has a first refractive index n, a second layer of the pixel defining layer has a second refractive index $n_2$, and a third layer of the pixel defining layer has a third refractive index $n_3$, wherein $n_1 > n_2 > n_3$.

8. The method according to claim 7,
wherein during the forming of the pixel defining layer, a slope angle Ø between a sidewall of the pixel defining layer and the substrate is calculated in advance, and then the pixel defining layer is formed according to the slope angle Ø, wherein calculating of the slope angle Ø comprises:

defining L as a distance between adjacent sub-pixels, H as a distance between the light emitting layer and the color film layer, and λout as a minimum angle between a thickness direction of the substrate and the first light causing optical crosstalk, and resulting in formula $$\lambda \text{out} = \arctan \frac{L}{H}; \quad (1)$$

defining n as refractive index of the light emitting layer and $n_3=n$, $\theta_1$ as an incident angle of the first light onto the sidewall of the third layer of the pixel defining layer, and Ø as the slope angle between the sidewall of the pixel defining layer and the substrate, and resulting in formula $$\emptyset \leq 180° - \arcsin\left(\frac{n_2}{n_1}\right) - \arcsin\left(\frac{n_3 \sin\theta_1}{n_1}\right); \quad (2)$$

wherein the Ø, the λout and the satisfies formula Ø=τ-λout-??₁ (3); and calculating the slope angle Ø according to the formulas (1), (2) and (3).

9. A display apparatus comprising a display panel, wherein the display panel comprises:
a substrate;
a pixel defining layer, disposed on the substrate and comprising an opening area corresponding to each sub-pixel, wherein the pixel defining layer comprises M layers and among the M layers of pixel defining layer, an m-th layer of pixel defining layer encapsulates upper and side surfaces of an (m−1)-th layer of pixel defining layer, and a refractive index $n_{m-1}$ of the (m−1)-th layer of pixel defining layer is greater than a refractive index nm of the m-th layer of pixel defining layer, and wherein M is a positive integer equal to or greater than 2 and 2≤m≤M;
a light emitting layer, disposed in the opening area, wherein the light emitting layer is in contact with a sidewall of an M-th layer of pixel defining layer, and light emitted from the light emitting layer comprises a first light incident into the pixel defining layer, and the first light is able to be totally reflected in the (m−1)-th layer of pixel defining layer, when the first light propagating in the (m−1)-th layer of pixel defining layer has an angle of incidence at the interface between the (m−1)-th layer of pixel defining layer and the m-th layer of pixel defining layer greater than a critical angle; and
a color film layer, disposed at a side of the light emitting layer away from the substrate,
wherein M=3, and a first layer of the pixel defining layer has a first refractive index $n_1$, a second layer of the pixel defining layer has a second refractive index $n_2$, and a third layer of the pixel defining layer has a third refractive index $n_3$, wherein $n_1 > n_2 > n_3$.

10. The display apparatus according to claim 9, wherein the light emitting layer has a refractive index n, and wherein $n_3 \geq n$.

11. The display apparatus according to claim 10, wherein the first layer of pixel defining layer comprises titanium dioxide, the second layer of pixel defining layer comprises silicon oxynitride, and the third layer of pixel defining layer comprises silicon dioxide.

12. The display apparatus according to claim 9, wherein the plurality of sub-pixels comprising a red sub-pixel, a green sub-pixel, and a blue sub-pixel, and wherein the light emitting layer comprises a blue organic light emitting layer disposed in respective sub-pixel, and the color film layer comprises a red quantum dot layer disposed in the red sub-pixel and a green quantum dot layer disposed in the green sub-pixel.

13. The display apparatus according to claim 9, wherein the plurality of sub-pixels comprising a red sub-pixel, a green sub-pixel, and a blue sub-pixel, and wherein the light emitting layer comprises a white organic light emitting layer disposed in respective sub-pixel, and the color film layer comprises a red filter layer disposed in the red sub-pixel, a green filter disposed in the green sub-pixel, and a blue filter layer disposed in the blue sub-pixel.

14. The display apparatus according to claim 12, wherein the color filter film is disposed in the opening area.

* * * * *